United States Patent
Song et al.

(10) Patent No.: US 10,775,439 B2
(45) Date of Patent: Sep. 15, 2020

(54) METHOD AND APPARATUS FOR ESTIMATING INITIAL CONDITION OF BATTERY

(71) Applicant: SAMSUNG ELECTRONICS CO., LTD., Suwon-si (KR)

(72) Inventors: Tae Won Song, Yongin-si (KR); Sung Ick Kim, Seoul (KR); Jin Ho Kim, Yongin-si (KR); Tae Jung Yeo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 246 days.

(21) Appl. No.: 15/290,718

(22) Filed: Oct. 11, 2016

(65) Prior Publication Data
US 2017/0125853 A1     May 4, 2017

(30) Foreign Application Priority Data
Nov. 2, 2015 (KR) .................. 10-2015-0153272

(51) Int. Cl.
| | | |
|---|---|---|
| G06F 17/50 | (2006.01) | |
| G01R 31/374 | (2019.01) | |
| H01M 10/0525 | (2010.01) | |
| H01M 10/48 | (2006.01) | |
| H01M 10/42 | (2006.01) | |

(52) U.S. Cl.
CPC ...... *G01R 31/374* (2019.01); *H01M 10/0525* (2013.01); *H01M 10/4285* (2013.01); *H01M 10/484* (2013.01); *H01M 10/486* (2013.01); *Y02T 10/7011* (2013.01)

(58) Field of Classification Search
USPC .......................................... 702/63
See application file for complete search history.

(56) References Cited

U.S. PATENT DOCUMENTS

| | | | |
|---|---|---|---|
| 6,366,054 B1 | 4/2002 | Hoenig et al. | |
| 7,800,345 B2 | 9/2010 | Yun et al. | |
| 8,264,203 B2 | 9/2012 | Darilek et al. | |
| 2014/0244225 A1* | 8/2014 | Balasingam | G06F 17/5036 703/2 |
| 2014/0361743 A1* | 12/2014 | Lin | H02J 7/0014 320/109 |
| 2015/0067379 A1 | 3/2015 | Tashima | |

FOREIGN PATENT DOCUMENTS

| | | |
|---|---|---|
| JP | 2002-181906 A | 6/2002 |
| JP | 4865523 B2 | 2/2012 |
| JP | 2012-108046 A | 6/2012 |
| KR | 10-0740114 B1 | 7/2007 |
| KR | 10-2008-0014207 A | 2/2008 |
| KR | 10-1268082 B1 | 6/2013 |
| KR | 10-1367161 B1 | 2/2014 |

\* cited by examiner

*Primary Examiner* — Lam S Nguyen
(74) *Attorney, Agent, or Firm* — NSIP Law

(57) ABSTRACT

An apparatus for estimating an initial condition of a battery includes a processor configured to calculate a stabilizing time of a lithium (Li) ion concentration in the battery, select an estimation model based on the stabilizing time, and estimate the initial condition of the battery to charge the battery using the selected estimation model.

25 Claims, 8 Drawing Sheets

METHOD AND APPARATUS FOR ESTIMATING INITIAL CONDITION OF BATTERY

CROSS-REFERENCE TO RELATED APPLICATIONS

This application claims the benefit under 35 USC 119(a) of Korean Patent Application No. 10-2015-0153272 filed on Nov. 2, 2015 in the Korean Intellectual Property Office, the entire disclosure of which is incorporated herein by reference for all purposes.

BACKGROUND

1. Field

The following description relates to a technique for estimating a battery's state of charge (SOC).

2. Description of Related Art

To stably and maximally use a battery's capacity, it is important to accurately estimate the battery's present SOC.

An Ah method or a coulomb counting method is a method that estimates the SOC of a battery by deriving a used capacity from a relationship between a use current and a time, and thus the SOC is estimated based on that information. A voltage measurement method is a method that estimates a battery's charge state from a relationship between the SOC and an open circuit voltage (OCV) previously measured from the OCV of the battery. A resistance measurement method is a method that estimates the battery state from a relationship between the SOC and internal resistance of the battery.

However, the coulomb counting method and the resistance measurement method may not reflect an electrochemical characteristic of the battery that is changed into a stabilized state after termination of an operation of the battery. In the voltage measurement method, since only an external voltage is measured without information about an internal state of the battery, an estimation error may possibly occur according to the actual internal state of the battery.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an apparatus for estimating an initial condition of a battery includes a processor configured to calculate a stabilizing time of a lithium (Li) ion concentration in the battery, select an estimation model based on the stabilizing time, and estimate the initial condition of the battery to charge the battery using the selected estimation model.

The apparatus may further include a memory configured to store instructions, wherein the processor is further configured to execute the instructions to configure the processor to calculate the stabilizing time of the Li ion concentration in the battery, select the estimation model based on the stabilizing time, and estimate the initial condition of the battery to charge the battery using the selected estimation model.

The processor may include a stabilizing time calculator configured to calculate the stabilizing time of the Li ion concentration in the battery, a model selector configured to select the estimation model based on the stabilizing time, and an initial condition estimator configured to estimate the initial condition of the battery to charge the battery using the selected estimation model.

The stabilizing time calculator may calculate a stabilizing time during which either one or both of the Li ion concentration in an electrode of the battery and the Li ion concentration in an electrolyte is stabilized from a use suspension time point of the battery.

The stabilizing time calculator may calculate the stabilizing time based on any one or any combination of two or more of a diffusion coefficient of Li ions in a anode, a diffusion coefficient of the Li ions in the electrolyte, a particle size of the electrode, a thickness of the electrode, a battery state of charge (SOC) at the use suspension time point of the battery, and a temperature.

The model selector may select the estimation model at a battery reoperation time point based on the stabilizing time, and the estimation model may be an electrochemical model, an open circuit voltage (OCV) estimation method, or a combination of an electrochemical model and an open circuit voltage (OCV) estimation method.

In response to the battery reoperation time point being within the stabilizing time, the model selector may select the electrochemical model as the estimation model.

The initial condition estimator may calculate either one or both of battery SOC and the Li ion concentration at a use suspension time point of the battery, and may estimate the initial condition of the battery using either one or both of an electrode reaction relationship and a concentration gradient of Li ions during a battery reoperation time.

The initial condition estimator may functionalize the electrochemical model as a function of a battery reoperation time at a use suspension time point of the battery.

In response to a concentration gradient of Li ions being a set value or less, the initial condition estimator may estimate the initial condition of the battery based on the battery SOC at a use suspension time point of the battery.

In response to the battery reoperation time point being after the stabilizing time, the model selector may select the OCV estimation method as the estimation model, and the initial condition estimator may measure an OCV, and may estimate the initial condition of the battery corresponding to the measured OCV by applying the OCV estimation method.

In response to the battery reoperation time point being within a time period of a stabilizing time boundary, the model selector may select both of the electrochemical model and the OCV estimation method as the estimation models, and the initial condition estimator may apply a weighted value to each of the electrochemical model and the OCV estimation method according to a proximity degree of the battery reoperation time point.

The initial condition estimator may estimate the initial condition of the battery based on a heat management condition including any one or any combination of two or more of a cell temperature, a cooling state, and a heating state.

In another general aspect, a method for estimating an initial condition of a battery, includes calculating a stabilizing time of a lithium (Li) ion concentration in the battery, selecting an estimation model based on the stabilizing time, and estimating the initial condition of the battery to charge the battery using the selected estimation model.

The calculating of the stabilizing time may include calculating a time during which either one or both of the Li ion concentration in an electrode of the battery and the Li ion concentration in an electrolyte is stabilized from a use suspension time point of the battery.

The calculating of the stabilizing time may include calculating the stabilizing time based on any one or any combination of two or more of a diffusion coefficient of Li ions in an anode, a diffusion coefficient of the Li ions in the electrolyte, a particle size of the electrode, a thickness of the electrode, a battery state of charge (SOC) at the use suspension time point of the battery, and a temperature.

The selecting of the estimation model may include selecting the estimation model at a battery reoperation time point based on the stabilizing time, and the estimation model may be one of an electrochemical model and an open circuit voltage (OCV) estimation method, or a combination of an electrochemical model and an open circuit voltage (OCV) estimation method.

In response to the battery reoperation time point being within the stabilizing time, the selecting of the estimation model may include selecting the electrochemical model as the estimation model.

The estimating of the initial condition may include calculating either one or both of battery SOC and the Li ion concentration at a use suspension time point of the battery, and estimating the initial condition of the battery using either one or both of an electrode reaction relationship and a concentration gradient of Li ions during a battery reoperation time.

The estimating of the initial condition may include functionalizing the electrochemical model as a function of a battery reoperation time at a use suspension time point of the battery.

In response to a concentration gradient of Li ions being a set value or less, the estimating of the initial condition may include estimating the initial condition of the battery based on the battery SOC at a use suspension time point of the battery.

In response to the battery reoperation time point being after the stabilizing time, the selecting of the estimation model may include selecting the OCV estimation method as the estimation model, and the estimating of the initial condition may include measuring an OCV, and estimating the initial condition of the battery corresponding to the measured OCV by applying the OCV estimation method.

In response to the battery reoperation time point being within a time period of a stabilizing time boundary, the selecting of the estimation model may include selecting both of the electrochemical model and the OCV estimation method as the estimation models, and the estimating of the initial condition may include applying a weighted value to each of the electrochemical model and the OCV estimation method according to a proximity degree of the battery reoperation time point.

The estimating of the initial condition may include estimating the initial condition of the battery based on a heat management condition comprising any one or any combination of two or more of a cell temperature, a cooling state, and a heating state.

In another general aspect, a non-transitory computer-readable storage medium stores instructions that, when executed by a processor, cause the processor to perform the method described above.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
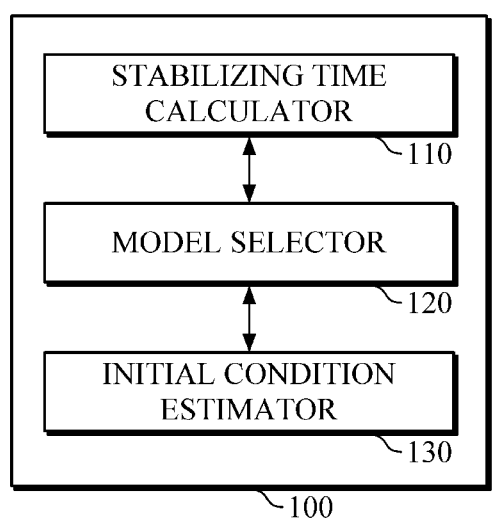
FIG. 1 is a block diagram illustrating an apparatus for estimating an initial condition of a battery according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a block diagram illustrating an apparatus for estimating an initial condition of a battery according to an example.

Generally, when a battery that is being operated is stopped, an open circuit voltage (OCV) in a no-load state is formed. When a predetermined time elapses, an electrode concentration converges to a predetermined value. However, at this point in time, because a voltage stabilizing time and an electrode concentration stabilizing time may be different from each other, it is required to select a different estimation model for an initial condition of the battery according to an electrode concentration.

Referring to the example of FIG. 1, an apparatus 100 for estimating an initial condition of a battery includes a stabilizing time calculator 110, a model selector 120 and an initial condition estimator 130.

The stabilizing time calculator 110 calculates a stabilizing time of a lithium (Li) ion concentration in the battery from a use suspension time point of the battery. For example, when the operation of the battery is stopped, the stabilizing time calculator 110 calculates a time at which at least one of the Li ion concentration in an electrode of the battery and the Li ion concentration in an electrolyte is stabilized from the use suspension time point of the battery.

The stabilizing time calculator 110 calculates the stabilizing time based on one or more parameters, such as a diffusion coefficient of Li ions in an anode, a diffusion coefficient of the Li ions in the electrolyte, a particle size of the electrode, a thickness of the electrode, battery state of charge (SOC) at the use suspension time point of the battery, and a temperature. However, these are example parameters and other parameters may also be used in the calculation of the stabilizing time, as appropriate.

As an example, the stabilizing time calculator 110 calculates the stabilizing time of the Li ion concentration in the electrode using Equation 1, as presented below.

$$\tau_{conc} = f(D_{an}, D_{ca}, r_{an}, r_{ca}, I_{an}, I_{ca}, SOC_{prev}, T)$$
$$\rightarrow \tau_{conc} \sim r_{an}^2/D_{an} \text{ or } I_{an}^2/D_{an} \qquad \text{Equation 1}$$

Referring to Equation 1, the stabilizing time calculator 110 calculates the stabilizing time of the Li ion concentration using $r_{an}$, which denotes a radius of an electrode active material, $I_{an}$, which denotes an electrode thickness, and $D_{an}$ which denotes the diffusion coefficient of the Li ions in the anode, as electrode variables. In Equation 1, subscripts an and ca refer to an anode and a cathode, respectively.

As another example, the stabilizing time calculator 110 calculates the stabilizing time of the Li ions in the electrolyte using Equation 2, as presented below.

$$\tau_{conc} = f(D_e, I_t, SOC_{prev}, T) \rightarrow \tau_{conc} \sim I_t^2/D_e \qquad \text{Equation 2}$$

Referring to Equation 2, the stabilizing time calculator 110 calculates the stabilizing time of the Li ion concentration in the electrolyte using $I_t$, which denotes overall thickness and $D_e$, which denotes the diffusion coefficient of the Li ions in the electrolyte, as electrolyte variables.

At this point, the stabilizing time is calculated at the use suspension time point of the battery, or is calculated at a battery reoperation time point. The stabilizing time of the Li ion concentration in the electrode calculated by the stabilizing time calculator 110 is possibly different from the voltage stabilizing time, and when a time that is sufficiently greater than the calculated stabilizing time of the Li ion concentration elapses, the Li ion concentration reaches an equilibrium state.

In this example, the battery reoperation time point may be a point of time when a standby time in which the SOC is not estimated in a battery management system (BMS) is generated due to a case in which an operation of an electric vehicle (EV) using a battery pack is stopped. Alternatively, the battery reoperation time point may be an example in which power of the battery pack is switched off, and then the battery is operated again after a predetermined time passes. Also, the apparatus 100 for estimating the initial condition of the battery may use a determination time point for estimating the SOC in the BMS, which is other than the battery reoperation time point, as a reference time point. Such an approach may also be similarly applied not only to an example in which use of the battery is stopped, but also an example in which the power of the battery pack is temporarily cut off, and the Li ion concentration is stabilized after a predetermined time passes. In addition to the proposed example, various other examples may also be provided.

In this example, the model selector 120 selects an estimation model based on the stabilizing time. In such an example, the estimation model may include one of an electrochemical model and an OCV estimation method, or a combination of such methods. However, these are only examples and other appropriate estimation models may be used as well.

For example, there may be a standby time that elapses until the operation of the battery begins again after being stopped. At this point, the model selector 120 may compare the battery reoperation time point, at which the stopped battery is reused, with the stabilizing time calculated in the stabilizing time calculator 110. Thus, the model selector 120 checks whether the battery reoperation time point is within or after the stabilizing time, or within a predetermined time of a stabilizing time boundary, and thus may determine a non-equilibrium state, a critical section, or an equilibrium state of the Li ion concentration.

Also, when the battery reoperation time point is within the stabilizing time, the model selector 120 selects the electrochemical model as the estimation model. The electrochemical model is an estimation model based on electrochemical kinetics and a transportation phenomenon of particles, and is applicable to an example in which there is a grade in a concentration gradient of Li ions.

Meanwhile, because the OCV estimation method does not consider an influence due to the Li ion concentration, an estimation error is possibly generated when the OCV estimation method is applied while the Li ion concentration is in the non-equilibrium state. At this point, the model selector 120 may minimize the estimation error of the initial condition, which may not be deduced by only using the OCV estimation method, by selecting the electrochemical model as the estimation model during a time period in which the Li ion concentration is in the non-equilibrium state.

As another example, when the battery reoperation time point is after the stabilizing time, the model selector 120 selects the OCV estimation method as the estimation model. An OCV may be measured independently of the Li ion concentration, and when the OCV is measured, a corresponding initial condition of the battery is estimated using a predetermined table.

As still another example, when the battery reoperation time point is within the predetermined time interval of the stabilizing time boundary, the model selector 120 selects both of the electrochemical model and the OCV estimation method.

In this example, the initial condition estimator 130 estimates the initial condition for charging the battery using the selected estimation model. For example, when the electrochemical model is selected, the initial condition estimator 130 calculates at least one of the Li ion concentration at the use suspension time point of the battery and the battery SOC at the use suspension time point of the battery. Also, in an example, the initial condition estimator 130 calculates the actually usable battery SOC from the concentration gradient of the Li ions during a battery reoperation time and an electrode reaction relationship, such as a Butler-Volmer relationship, an electrode surface concentration, an electrolyte concentration, or another metric that characterizes the effect of the Li ion concentration gradient on the battery SOC. Based on such information, the initial condition estimator 130 estimates the initial condition of the battery for charging the battery.

For example, the initial condition estimator 130 estimates the Li ion concentration in the electrode or the Li ion concentration in the electrolyte at the use suspension time point of the battery at which the operation of the battery is stopped, and functionalizes the electrochemical model as time passes from the grade of the concentration gradient of the Li ions, or calculates the battery $SOC_{prev}$ at the use suspension time point of the battery, and thus functionalizes the electrochemical model as time passes from the electrode reaction relationship.

In such an example, the initial condition estimator 130 stores the electrochemical model as a function of a time so that the electrochemical model is able to be applied at the battery reoperation time point. For example, when the battery is operated again after a predetermined time passes, the initial condition estimator 130 measures or calculates the battery reoperation time, calculates the battery SOC at the battery reoperation time point by applying the battery reoperation time to the functionalized electrochemical model, and estimates the initial condition of the battery for charging the battery.

As another example, after the battery is operated again, the initial condition estimator 130 calculates values of variables at the use suspension time point of the battery, for example, the Li ion concentration in the electrode, the Li ion concentration in the electrolyte, the battery SOC, or other variables that are germane to the effects of ion concentration on the battery's operation. In such an example, the initial condition estimator calculates the battery's SOC at the battery reoperation time point using at least one of the electrode reaction relationship and the grade in the concentration gradient of Li ions during the battery reoperation time from the use suspension time point of the battery to the battery reoperation time point. Based on this information, the initial condition estimator 130 estimates the initial condition of the battery for subsequently charging the battery.

Meanwhile, when the concentration gradient of Li ions is a set threshold value or less than the threshold value, the concentration gradient of Li ions requirement for applying the electrochemical model is not satisfied. In this example, the initial condition estimator 130 may estimate the initial condition of the battery based on the battery SOC at the use suspension time point of the battery.

As still another example, when the OCV estimation method is selected, the initial condition estimator 130 measures the OCV, and estimates the initial condition of the battery corresponding to the OCV measured by applying the OCV estimation method. The OCV estimation method is a battery SOC estimation method that retrieves the battery SOC matched with the measured OCV using a predetermined table in which the OCV and the battery SOC are associated with each other.

As yet another example, when both of the electrochemical model and the OCV estimation method are selected for use as the estimation models, the initial condition estimator 130 applies a weighted value to the results of each of the electrochemical model and the OCV estimation method according to a proximity degree associated with the battery reoperation time point. For example, assuming that the stabilizing time calculated in the stabilizing time calculator 110 is $\tau_{conc}$, when there is a time $\alpha^*\tau_{conc}$ or more, which is $\alpha$ times larger, from the stabilizing time, the Li ion concentration is set to be in the equilibrium state. At this point, $\alpha$ may be about 1 to 2 times the stabilizing time. When the model selector 120 determines a time between $\tau_{conc}$ and $\alpha^*\tau_{conc}$ as the critical section in the equilibrium state, and selects both of the electrochemical model and the OCV estimation method as the estimation models, the initial condition estimator 130 establishes the weighted value w as follows.

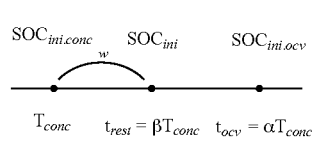

In this example, $\tau_{conc}$ is the stabilizing time, and $\tau_{ocv}$ is a sufficient time for the Li ion concentration to reach the equilibrium state, and is $\alpha*\tau_{conc}$ (ex. $1<\alpha<2$). Thus, in this example, $t_{rest}$ is the determination time point that determines a current initial condition, and is the battery reoperation time point, and $t_{rest}$ is $\beta*\tau_{conc}$.

At this point, in such an example, the initial condition estimator 130 applies the weighted value w in a time-weighted average type using Equation 3, as presented below.

$$SOC_{ini}=w \cdot SOC_{ini,OCV}+(1-w) \cdot SOC_{ini,conc} \quad \text{Equation 3}$$

When the weighted value w is formulated with parameters regarding $\alpha$ and $\beta$, it is calculated as follows.

$$\frac{SOC_{ini}-SOC_{ini,conc}}{t_{rest}-\tau_{conc}}=\frac{SOC_{ini,ocv}-SOC_{ini,conc}}{\tau_{ocv}-\tau_{conc}}$$

$$\therefore w=\frac{\beta-1}{\alpha-1}$$

That is, in an example in which the battery reoperation time point $t_{rest}$ is close to the stabilizing time $\tau_{conc}$ of the Li ion concentration, the initial condition estimator 130 applies a greater weighted value to the electrochemical model $SOC_{ini,conc}$. Also, in an example in which the battery reoperation time point $t_{rest}$ is close to a times the stabilizing time, that is, $\alpha*\tau_{conc}$, a greater weighted value is applied to the OCV estimation method. For example, the initial condition estimator 130 determines a ratio between the weighted value of the electrochemical model and the weighted value of the OCV estimation method according to the proximity degree of the battery reoperation time point.

Also, in an example, the initial condition estimator 130 calculates the battery SOC in further consideration of a heat management condition based on at least one of a cell temperature, a cooling state, and a heating state. In addition to the Li ion concentration, the heat management condition is optionally used as a significant parameter to determine the initial condition for charging the battery. For example, the initial condition estimator 130 calculate the battery SOC in consideration of a temperature, a cooling ratio, or another heat related factor of the battery that affects battery performance, during the standby time until the operation of the battery is operated again after being stopped, and accordingly estimates the initial condition for charging the battery.

Meanwhile, the initial condition estimator 130 measures or calculates required variables and parameters before the selection of the estimation model, measures a change in the Li ion concentration changes as time passes, and reflects the measured change in the estimation model.

Figure 2:
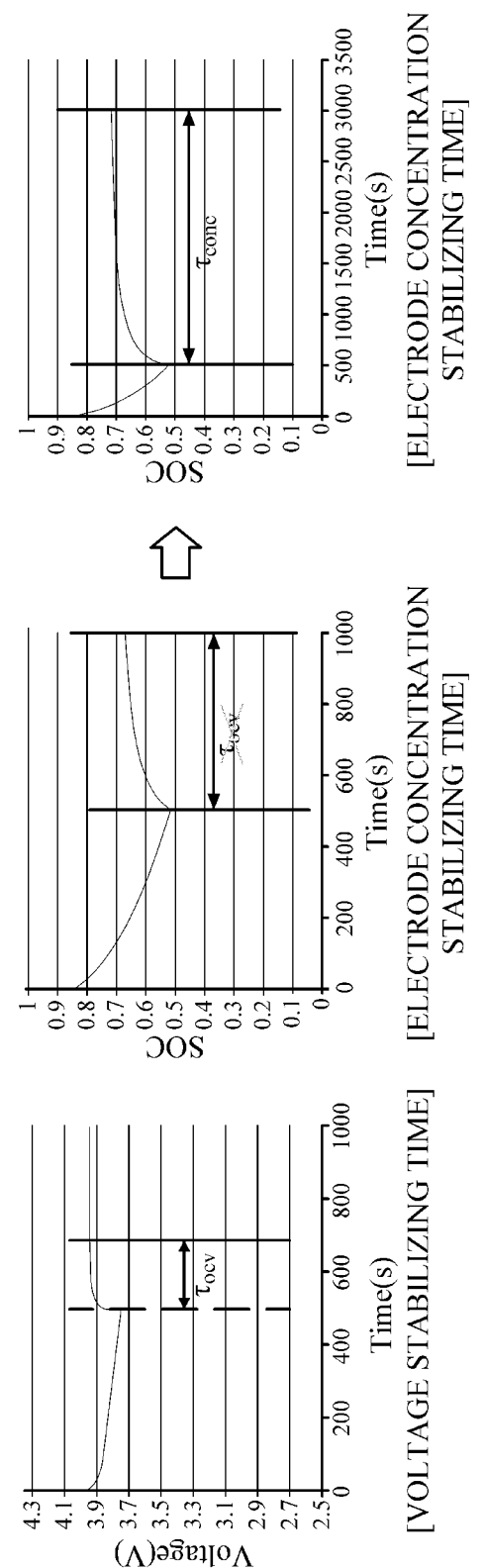
FIG. 2 is a diagram illustrating an example of a voltage stabilizing time and an electrode concentration stabilizing time.

FIG. 2 is a diagram illustrating an example of a voltage stabilizing time and an electrode concentration stabilizing time. Referring to the example of FIG. 2, the voltage stabilizing time is possibly deduced from a time/voltage graph located on the left of the example of FIG. 2. When the operation of the battery is stopped, after a period of 500 seconds, the OCV inside the battery increases and then converges to a constant value.

However, at this point in time, the voltage stabilizing time and the electrode concentration stabilizing time possibly do not coincide with each other. Referring to a battery SOC/time graph located at the center of the example of FIG. 2, it is to be understood that a start point and an end point of the electrode concentration stabilizing time are different from those of the voltage stabilizing time.

Also, with reference to the battery SOC/time graph located on the right side in FIG. 2, the electrode concentration stabilizing time $\tau_{conc}$ is able to be deduced as a time of about 500 to 3000 seconds, and this time is longer than the voltage stabilizing time. That is, it is appropriate for the electrode concentration stabilizing time to be measured or calculated separately from the voltage stabilizing time.

Figure 3:
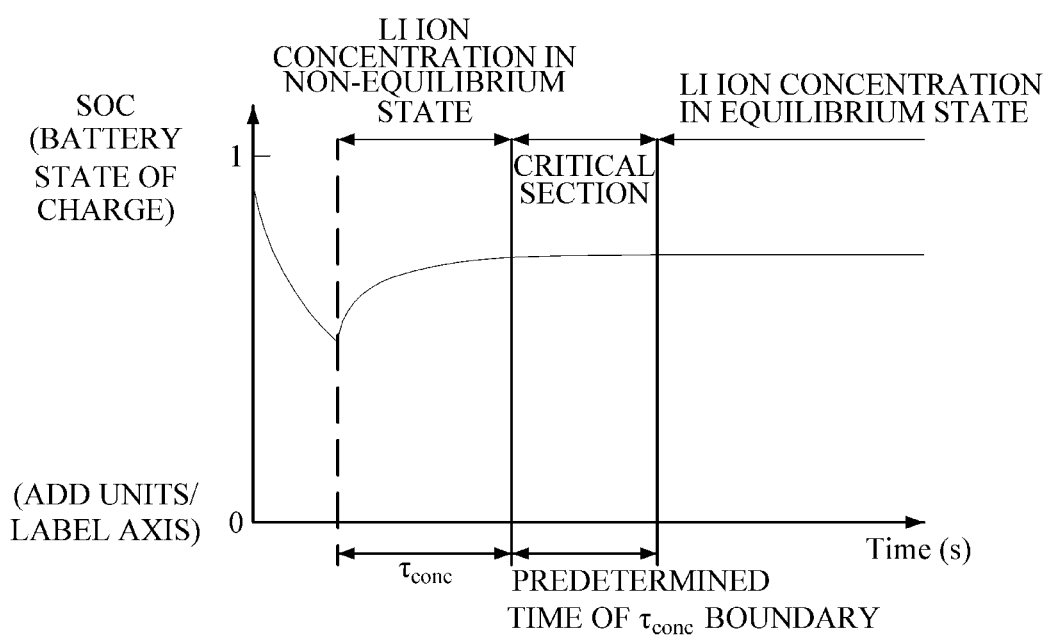
FIG. 3 is a diagram illustrating an example of an equilibrium state of a Li ion concentration according to the electrode concentration stabilizing time.

FIG. 3 is a diagram illustrating an example of the equilibrium state of the Li ion concentration according to the electrode concentration stabilizing time. Referring to the apparatus 100 for estimating the initial condition of the battery of the example of FIG. 1, the model selector 120 determines the non-equilibrium state, the critical section and the equilibrium state of the Li ions from the stabilizing time of the Li ions calculated by the stabilizing time calculator 110.

Referring to the example of FIG. 3, when the operation of the battery is stopped, stabilization of the Li ion concentration in the battery is delayed due to diffusion, and the Li ion concentration in the battery converges to the equilibrium state after a sufficiently long time has elapsed.

For example, when the battery reoperation time point is within the stabilizing time $\tau_{conc}$, the model selector 120 determines the Li ion concentration as being in the non-equilibrium state, and selects the electrochemical model as the estimation model. Additionally, when the battery reoperation time point is after the stabilizing time $\tau_{conc}$, the model selector 120 determines the Li ion concentration as being in the equilibrium state, and accordingly selects the OCV estimation method as the estimation model.

At this point, the critical section may be between the non-equilibrium state and the equilibrium state. According to an example, the critical section is a time which is about 1 to 2 times the stabilizing time. In such an example, the model selector 120 establishes the critical section as occurring within a predetermined time of the stabilizing time boundary, and selects the electrochemical model along with the OCV estimation method as the estimation model when the battery reoperation time point is within the critical section.

Meanwhile, in addition to the example of FIG. 3, because it is possible to bisect and determine two states of the equilibrium state and the non-equilibrium state from the stabilizing time without the critical section according to a setting, the examples are not limited to the proposed examples, but may include other variations that use the information discussed above to achieve similar goals to the proposed examples.

Figure 4A:
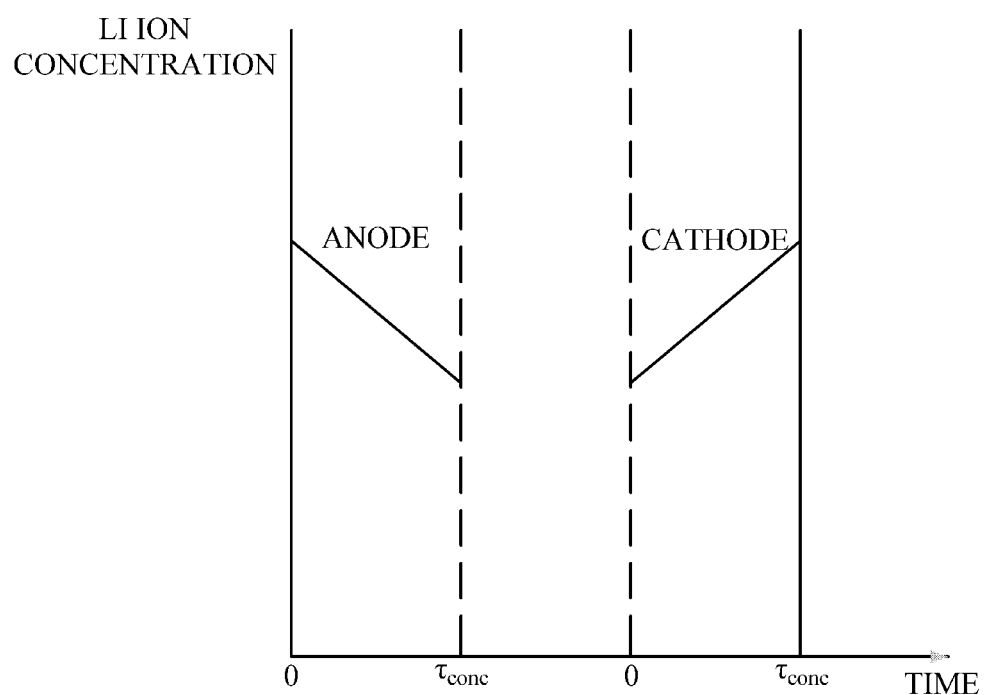
FIG. 4A is a diagram illustrating an example of a non-equilibrium state of the Li ion concentration in an electrode.

FIG. 4A is a diagram illustrating an example of the non-equilibrium state of the Li ion concentration in an electrode. Referring to the example of FIG. 4A, a change in the Li ion concentration in an anode AN and a cathode CN according to the passage of time is illustrated. The Li ions diffuse from a high density area to a low density area due to a diffusion phenomenon that occurs due to the tendency of ion concentration to equalize until balanced. Accordingly, as illustrated in the example of FIG. 4A, when the operation of the battery is stopped at 500 seconds, the Li ion concentration in the cathode CN and the anode AN is reduced at a predetermined inclination until the stabilizing time $\tau_{conc}$ occurs.

Figure 4B:
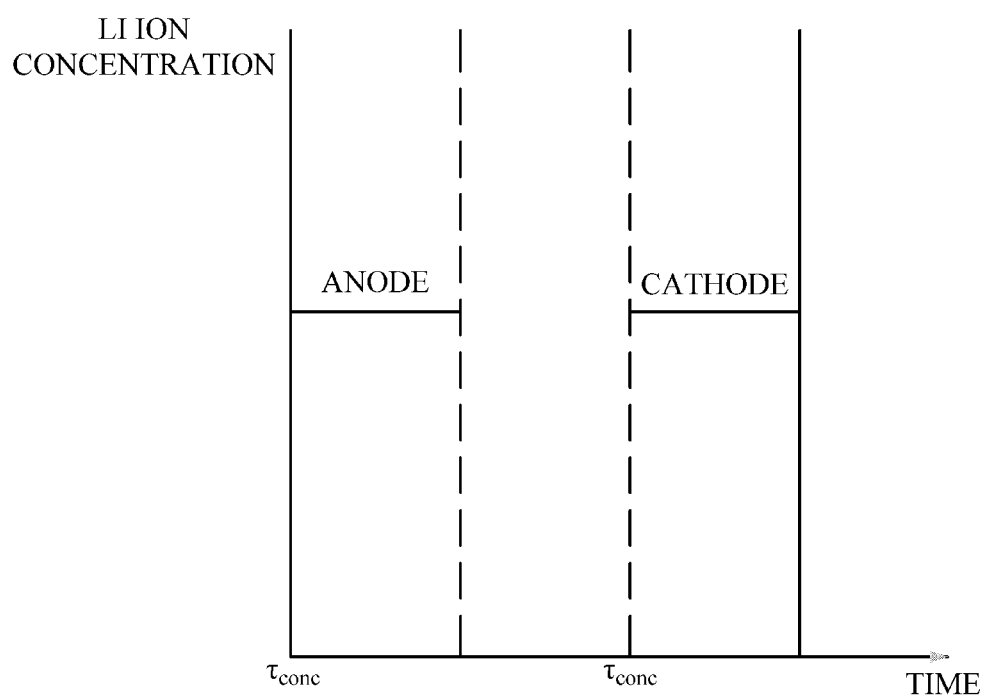
FIG. 4B is a diagram illustrating an example of the equilibrium state of the Li ion concentration in the electrode.

FIG. 4B is a diagram illustrating an example of the equilibrium state of the Li ion concentration in the electrode. The Li ion concentration reaches the equilibrium state after the stabilizing time $\tau_{conc}$ has occurred. At this point in time referring to the example of FIG. 4B, the Li ion concentration in each of the cathode CN and the anode AN is constant.

Figure 5:
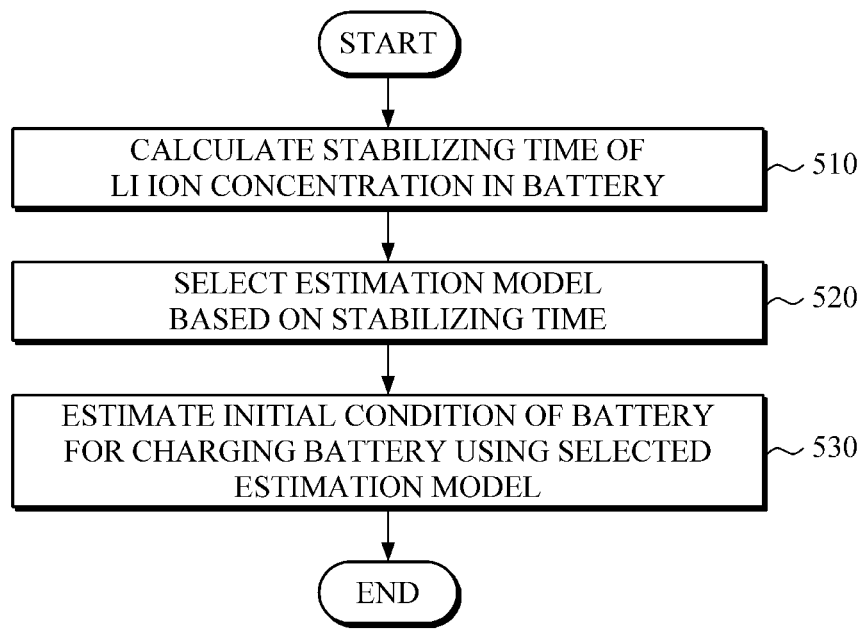
FIG. 5 is a flowchart illustrating a method for estimating an initial condition of a battery according to an example.

FIG. 5 is a flowchart illustrating a method for estimating the initial condition of the battery according to an example. Subsequently, a method for estimating the initial condition of the battery using the apparatus 100 for estimating the initial condition of the battery of FIG. 1 is described further.

First, in operation S510, the stabilizing time calculator 110 calculates the stabilizing time of the Li ion concentration in the battery from the use suspension time point of the battery. For example, when the operation of the battery is stopped, the stabilizing time calculator 110 calculates a time, at which at least one of the Li ion concentration in the electrode of the battery and the Li ion concentration in the electrolyte is stabilized, from the use suspension time point of the battery.

For example, the stabilizing time calculator 110 calculates the stabilizing time based on one or more parameters such as the diffusion coefficient of the Li ions in the anode, the diffusion coefficient of the Li ions in the electrolyte, the particle size of the electrode, the thickness of the electrode, the battery SOC at the use suspension time point of the battery, and the temperature. However, other factors that help define physical characteristics of the system in a way that facilitates calculation of the stabilizing time are used in other examples to help calculate the stabilizing time.

For example, the stabilizing time calculator 110 may calculate the stabilizing time of the Li ion concentration in the electrode using the following Equation 4, as presented below.

$$\tau_{conc} = f(D_{an}, D_{ca}, r_{an}, r_{ca}, I_{an}, I_{ca}, SOC_{prev}, T)$$
$$\rightarrow \tau_{conc} \sim r_{an}^2/D_{an} \text{ or } I_{an}^2/D_{an} \qquad \text{Equation 4}$$

Referring to Equation 4, the stabilizing time calculator 110 calculates the stabilizing time of the Li ion concentration using $r_{an}$, which denotes the radius of the electrode active material, $I_{an}$, which denotes the electrode thickness, and $D_{an}$, which denotes the diffusion coefficient of the Li ions in the anode, as the electrode variables. Here, the subscripts an and ca refer to the anode electrode and the cathode electrode, respectively.

As another example, the stabilizing time calculator 110 calculates the stabilizing time of the Li ions in the electrolyte using Equation 5, as presented below.

$$\tau_{conc} = f(D_e, I_t, SOC_{prev}, T) \rightarrow \tau_{conc} \sim I_t^2/D_e \qquad \text{Equation 5}$$

Referring to Equation 5, the stabilizing time calculator 110 may calculate the stabilizing time of the Li ion concentration in the electrolyte using $I_t$, which denotes overall thickness, and $D_e$, which denotes the diffusion coefficient of the Li ions in the electrolyte, as electrolyte variables.

Subsequently, in operation S520, the model selector 120 selects the estimation model based on the stabilizing time. At this point in the method, the estimation model may include one of the electrochemical model and the OCV estimation method, or a combination of these possibilities.

For example, at this point in the method, there may be the standby time left to elapse until the operation of the battery begins again after being stopped. Thus, in such an example, at this point, the model selector 120 compares the battery reoperation time point, at which the stopped battery is reused, with the stabilizing time calculated in the stabilizing time calculator 110, and checks whether the battery reoperation time point is within or after the stabilizing time, or within the predetermined time of the stabilizing time boundary, and thus determines the state, from among the non-equilibrium state, the critical section or the equilibrium state, of the Li ion concentration.

For example, when the battery reoperation time point is within the stabilizing time, the model selector 120 selects the electrochemical model as the estimation model. At this point in time, the Li ion concentration is in the non-equilibrium state. As another example, when the battery reoperation time point is after the stabilizing time, the model selector 120 selects the OCV estimation method as the estimation model. At this point in time, the Li ion concentration is in the equilibrium state. As still another example, when the battery reoperation time point is within the predetermined time of the stabilizing time boundary, the model selector 120 selects both of the electrochemical model and the OCV estimation method as the estimation models. At this point in time, the Li ion concentration is between the equilibrium state and the non-equilibrium state. An example related to this approach is described further below with reference to the examples of FIGS. 6 and 7.

Then, at operation S530, the initial condition estimator 130 estimates the initial condition for charging the battery using the selected estimation model. For example, when the electrochemical model is selected by the model selector 120, the initial condition estimator 130 calculates at least one of the Li ion concentration at the use suspension time point of the battery and the battery SOC at the use suspension time point of the battery, and may calculate the actually usable battery SOC from the concentration gradient of the Li ions during the battery reoperation time and the electrode reaction relationship, such as by using the Butler-Volmer relationship, the electrode surface concentration, the electrolyte concentration, or a similar metric that provides information about the concentration gradient of the Li ions, and estimating the initial condition of the battery for charging the battery.

As another example, when the OCV estimation method is selected by the model selector 120, the initial condition estimator 130 measures the OCV, and estimates the initial condition of the battery corresponding to the measured OCV by applying the OCV estimation method.

As still another example, when both of the electrochemical model and the OCV estimation method are selected by the model selector 120, the initial condition estimator 130 applies the weighted value according to a time ratio to each of the electrochemical model and the OCV estimation method according to the proximity degree of the battery reoperation time point.

Also, the initial condition estimator 130 calculates the battery SOC in further consideration of the heat management condition based on at least one of the cell temperature, the cooling state, and the heating state. In an example, in addition to the Li ion concentration, the heat management condition is used as a significant parameter to determine the initial condition for charging the battery. The initial condition estimator 130 calculates the battery SOC in consideration of the temperature, the cooling ratio or another heat related aspect of the battery that affects its charge retention properties during the standby time until the operation of the battery is operated again after being stopped, and estimates the initial condition for charging the battery.

Meanwhile, the initial condition estimator 130 measures or calculates the necessary variables and parameters before the selection of the estimation model, measures the change in the Li ion concentration which is changed as time passes, and appropriately reflects the measured change in the estimation model.

Figure 6:
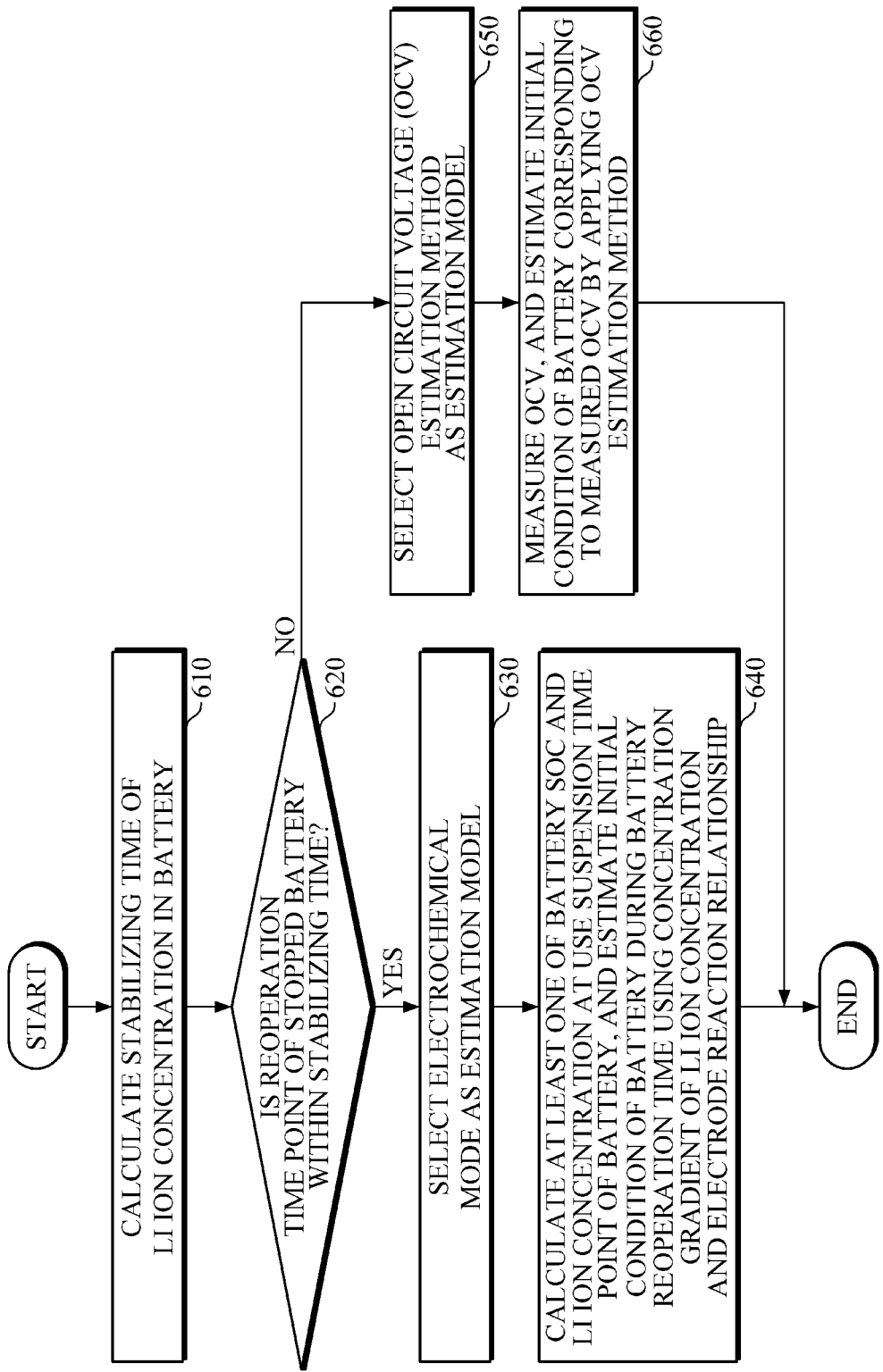
FIG. 6 is a detailed flowchart illustrating a method for estimating the initial condition of the battery according to an example.

FIG. 6 is a detailed flowchart illustrating a method for estimating the initial condition of the battery according to an example. Subsequently, a method for estimating the initial condition of the battery using the apparatus 100 for estimating the initial condition of the battery of FIG. 1 is described further, and descriptions of configurations overlapping with those in FIG. 5 are omitted for brevity.

First, in operation S610, the stabilizing time calculator 110 calculates the stabilizing time of the Li ion concentration in the battery.

Then, in operation S620, the model selector 120 determines whether the battery reoperation time point is within the stabilizing time. For example, when the determination time point is determined to be within the stabilizing time in operation S620, in operation S630, the model selector 120 selects the electrochemical model as the estimation model. In this example, the electrochemical model is the estimation model based on electrochemical kinetics and the transportation phenomenon of the particles, and is applied to the example in which there is a grade present in the concentration gradient of the Li ions.

Then, in operation S640, when the electrochemical model is selected, the initial condition estimator 130 estimates the initial condition of the battery from the concentration gradient of the Li ions and the electrode reaction relationship by applying the electrochemical model.

For example, the initial condition estimator 130 calculates the actually usable battery SOC from the electrode reaction relationship, such as the Butler-Volmer relationship, the electrode surface concentration, the electrolyte concentration or a similar metric that provides information about the concentration gradient of the Li ions using the electrochemical model, and estimates the initial condition of the battery for charging the battery.

As an example, the initial condition estimator 130 calculates the Li ion concentration in the electrode or the Li ion concentration in the electrolyte at the use suspension time point of the battery at which the operation of the battery is stopped, and functionalizes the electrochemical model as time passes from the grade of the concentration gradient of the Li ions, or calculates the battery $SOC_{prev}$ at the use suspension time point of the battery, and thus may functionalize the electrochemical model as time passes from the electrode reaction relationship.

For example, the initial condition estimator 130 may store the electrochemical model as a function of a time so that the electrochemical model is able to be applied at the battery reoperation time point. When the battery is operated again after a predetermined time passes, the initial condition estimator 130 measures or calculates the battery reoperation time, calculates the battery SOC at the battery reoperation time point by applying the battery reoperation time to the functionalized electrochemical model, and estimates the initial condition of the battery for charging the battery.

As another example, after the battery is operated again, the initial condition estimator 130 calculates values of variables at the use suspension time point of the battery, for example, the Li ion concentration in the electrode, the Li ion concentration in the electrolyte, the battery SOC, or other variables related to the operation characteristics of the battery. For example, the initial condition estimator 130 calculates the battery SOC at the battery reoperation time point using at least one of the electrode reaction relationship and the grade in the concentration gradient of Li ions during the battery reoperation time from the use suspension time point of the battery to the battery reoperation time point, and estimates the initial condition of the battery for charging the battery accordingly.

Meanwhile, when the concentration gradient of Li ions is a set value or less than the set value, the concentration gradient of Li ions for applying the electrochemical model is not satisfied. In this example, the initial condition estimator 130 estimates the initial condition of the battery based on the battery SOC at the use suspension time point of the battery.

According to another example, when the battery reoperation time point is after the stabilizing time in operation S620, in operation S650, the model selector 120 selects the OCV estimation method as the estimation model. The OCV is measured independently of the Li ion concentration, and when the OCV is measured, the corresponding initial condition of the battery is estimated using a predetermined table.

At this point, the initial condition estimator 130 measures the OCV, and estimates the initial condition of the battery corresponding to the measured OCV by applying the OCV estimation method in operation S660.

Figure 7:
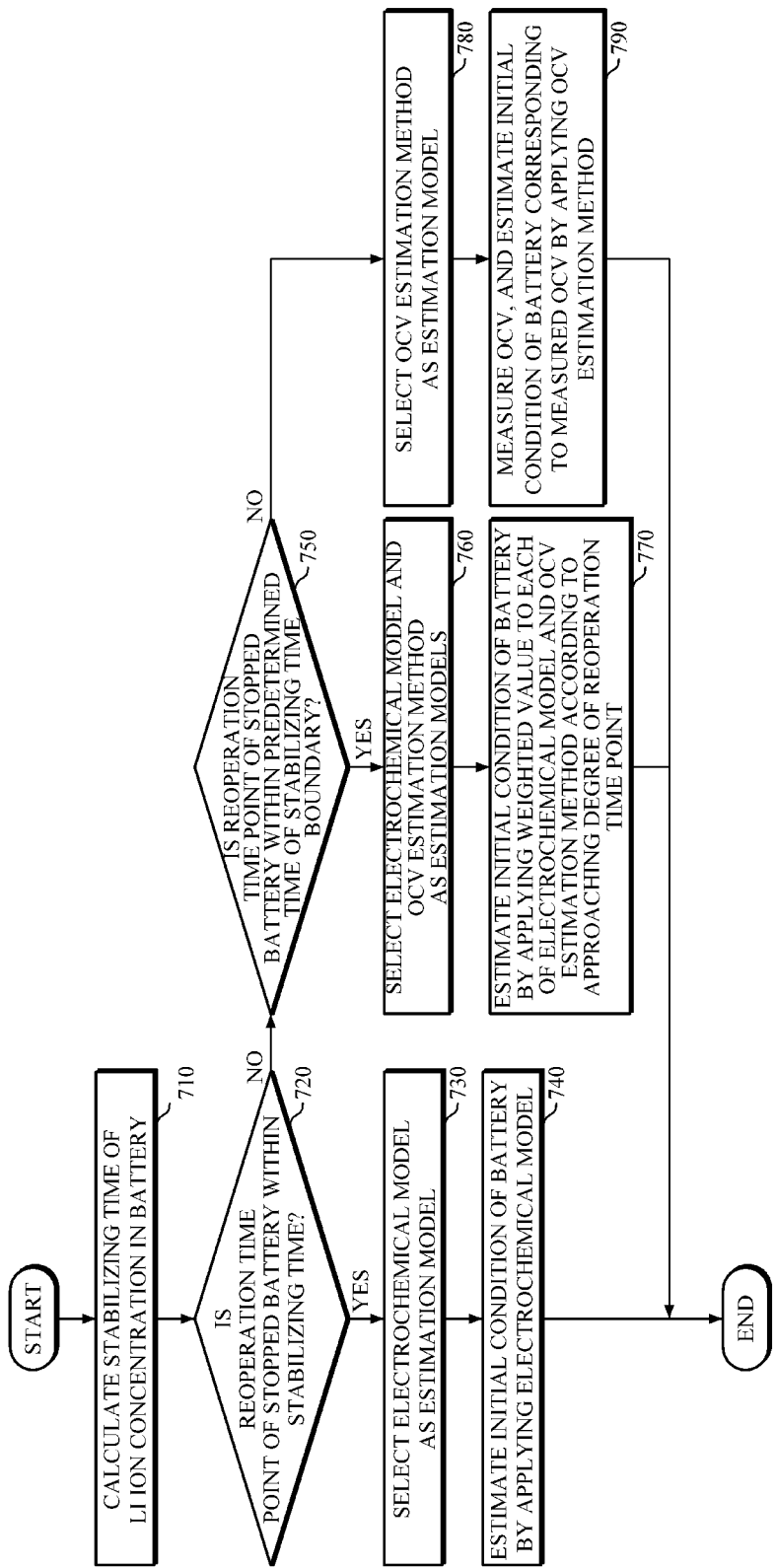
FIG. 7 is a detailed flowchart illustrating a method for estimating an initial condition of a battery according to another example.

FIG. 7 is a detailed flowchart illustrating a method for estimating an initial condition of a battery according to another example. In FIG. 7, the apparatus 100 for estimating the initial condition of the battery of FIG. 1 is used, and descriptions of configurations overlapping with those in FIG. 6 are omitted for brevity.

First, the stabilizing time calculator 110 calculates the stabilizing time of the Li ion concentration in the battery in operation S710.

Then, when the battery reoperation time point is within the stabilizing time in operation S720, the model selector 120 selects the electrochemical model as the estimation model in operation S730. Then, the initial condition estimator 130 estimates the initial condition of the battery by applying the electrochemical model using the concentration gradient of the Li ions in operation S740. At this time, the initial condition estimator 130 estimates the initial condition of the battery from the concentration gradient of the Li ions and the electrode reaction relationship by applying the electrochemical model.

Meanwhile, when the battery reoperation time point is after the stabilizing time, in operation S750, the model selector 120 determines whether the battery reoperation time point is within the predetermined time of the stabilizing time boundary.

When the battery reoperation time point is within the predetermined time of the stabilizing time boundary, in operation S750, the model selector 120 determines the Li ion concentration at the battery reoperation time point as the equilibrium state, and selects the OCV estimation method as the estimation model in operation S780. Then, the initial condition estimator 130 measures the OCV, and estimates the initial condition of the battery corresponding to the measured OCV by applying the OCV estimation method in operation S790.

When the battery reoperation time point is after the stabilizing time and within the predetermined time of the stabilizing time boundary, in operation S750, the model selector 120 selects both of the electrochemical model and the OCV estimation method as the estimation models in operation S760.

Then, the initial condition estimator 130 applies the weighted value to each of the electrochemical model and the OCV estimation method according to the proximity degree of the battery reoperation time point in operation S770. For example, assuming that the stabilizing time calculated in the stabilizing time calculator 110 is $\tau_{conc}$, when there is a time $\alpha*\tau_{conc}$ or more, which is $\alpha$ times larger, from the stabilizing time, the Li ion concentration is set to be in the equilibrium state. At this point, $\alpha$ may be about 1 to 2 times the stabilizing time. When the model selector 120 determines a time between $\tau_{conc}$ and $\alpha*\tau_{conc}$ as being the critical section in the equilibrium state, and selects both of the electrochemical model and the OCV estimation method as the estimation models, the initial condition estimator 130 establishes the weighted value w as follows.

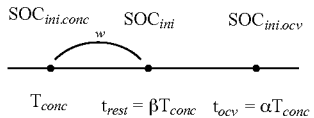

In this diagram, $\tau_{conc}$ is the stabilizing time, and $\tau_{ocv}$ is a sufficient time for the Li ion concentration to reach the equilibrium state, and has a value of $\alpha^*\tau_{conc}$, for example, such that $1<\alpha<2$. In such an example, t is the determination time point that determines a current initial condition, and may be the battery reoperation time point, and $t_{rest}$ is $\beta^*\tau_{conc}$.

At this point in the operation, in an example, the initial condition estimator 130 applies the weighted value w in a time-weighted average type using Equation 6, as presented below.

$$SOC_{ini}=w \cdot SOC_{ini,OCV}+(1-w) \cdot SOC_{ini,conc} \qquad \text{Equation 6}$$

When the weighted value w is formulated with parameters regarding $\alpha$ and $\beta$, it is found as follows.

$$\frac{SOC_{ini} - SOC_{ini,conc}}{t_{rest} - \tau_{conc}} = \frac{SOC_{ini,ocv} - SOC_{ini,conc}}{\tau_{ocv} - \tau_{conc}}$$

$$\therefore w = \frac{\beta - 1}{\alpha - 1}$$

That is, when the battery reoperation time point $\tau_{rest}$ is close to the stabilizing time $\tau_{conc}$ of the Li ion concentration, the initial condition estimator 130 applies a greater weighted value to the electrochemical model $SOC_{ini,conc}$. Also, in such an example, when the battery reoperation time point $t_{rest}$ is close to a times the stabilizing time, that is, $\alpha^*\tau_{conc}$, a greater weighted value is applied to the OCV estimation method. For example, the initial condition estimator 130 determines a ratio between the weighted value of the electrochemical model and the weighted value of the OCV estimation method according to the proximity degree of the battery reoperation time point.

The stabilizing time calculator, mode selector, and initial condition estimator in FIG. 1 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 5-7 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An apparatus for estimating an initial condition of a battery, comprising:
    a processor configured to:
        calculate a stabilizing time of a lithium (Li) ion concentration in the battery;
        select an estimation model from estimation models each having an established stabilizing time based on the stabilizing time corresponding to one of the established stabilizing times; and
        estimate the initial condition of the battery to charge the battery using the selected estimation model,
    wherein the estimation models include an electrochemical model and an open circuit voltage (OCV) estimation method, or a combination of an electrochemical model and an open circuit voltage (OCV) estimation method.

2. The apparatus of claim 1, further comprising a memory configured to store instructions,
    wherein the processor is further configured to:
        execute the instructions to configure the processor to calculate the stabilizing time of the Li ion concentration in the battery;
        select the estimation model based on the stabilizing time; and
        estimate the initial condition of the battery to charge the battery using the selected estimation model.

3. The apparatus of claim 1, wherein the processor comprises:
    a stabilizing time calculator configured to calculate the stabilizing time of the Li ion concentration in the battery;
    a model selector configured to select the estimation model based on the stabilizing time; and
    an initial condition estimator configured to estimate the initial condition of the battery to charge the battery using the selected estimation model.

4. The apparatus of claim 3, wherein the stabilizing time calculator calculates a stabilizing time during which either one or both of the Li ion concentration in an electrode of the battery and the Li ion concentration in an electrolyte is stabilized from a use suspension time point of the battery.

5. The apparatus of claim 4, wherein the stabilizing time calculator calculates the stabilizing time based on any one or any combination of two or more of an diffusion coefficient of Li ions in a anode, a diffusion coefficient of the Li ions in the electrolyte, a particle size of the electrode, a thickness of the electrode, a battery state of charge (SOC) at the use suspension time point of the battery, and a temperature.

6. The apparatus of claim 3, wherein the model selector selects the estimation model at a battery reoperation time point based on the stabilizing time.

7. The apparatus of claim 6, wherein, in response to the battery reoperation time point being within the stabilizing time, the model selector selects the electrochemical model as the estimation model.

8. The apparatus of claim 7, wherein the initial condition estimator calculates either one or both of battery SOC and the Li ion concentration at a use suspension time point of the battery, and estimates the initial condition of the battery using either one or both of an electrode reaction relationship and a concentration gradient of Li ions during a battery reoperation time.

9. The apparatus of claim 8, wherein the initial condition estimator functionalizes the electrochemical model as a function of a battery reoperation time at a use suspension time point of the battery.

10. The apparatus of claim 8, wherein, in response to a concentration gradient of Li ions being a set value or less, the initial condition estimator estimates the initial condition of the battery based on the battery SOC at a use suspension time point of the battery.

11. The apparatus of claim 6, wherein, in response to the battery reoperation time point being after the stabilizing time, the model selector selects the OCV estimation method as the estimation model, and
    the initial condition estimator measures an OCV, and estimates the initial condition of the battery corresponding to the measured OCV by applying the OCV estimation method.

12. The apparatus of claim 6, wherein, in response to the battery reoperation time point being within a time period of a stabilizing time boundary, the model selector selects both of the electrochemical model and the OCV estimation method as the estimation models, and the initial condition estimator applies a weighted value to each of the electrochemical model and the OCV estimation method according to a proximity degree of the battery reoperation time point.

13. The apparatus of claim 3, wherein the initial condition estimator estimates the initial condition of the battery based on a heat management condition comprising any one or any combination of two or more of a cell temperature, a cooling state, and a heating state.

14. A method for estimating an initial condition of a battery, comprising:
    calculating a stabilizing time of a lithium (Li) ion concentration in the battery;
    selecting an estimation model from estimation models each having an established stabilizing time based on the stabilizing time corresponding to one of the established stabilizing times; and
    estimating the initial condition of the battery to charge the battery using the selected estimation model,
    wherein the estimation models include an electrochemical model and an open circuit voltage (OCV) estimation method, or a combination of an electrochemical model and an open circuit voltage (OCV) estimation method.

15. The method according to claim 14, wherein the calculating of the stabilizing time comprises calculating a time during which either one or both of the Li ion concentration in an electrode of the battery and the Li ion concentration in an electrolyte is stabilized from a use suspension time point of the battery.

16. The method according to claim 15, wherein the calculating of the stabilizing time comprises calculating the stabilizing time based on any one or any combination of two or more of a diffusion coefficient of Li ions in an anode, a diffusion coefficient of the Li ions in the electrolyte, a particle size of the electrode, a thickness of the electrode, a battery state of charge (SOC) at the use suspension time point of the battery, and a temperature.

17. The method according to claim 14, wherein the selecting of the estimation model comprises selecting the estimation model at a battery reoperation time point based on the stabilizing time.

18. The method according to claim 17, wherein, in response to the battery reoperation time point being within the stabilizing time, the selecting of the estimation model comprises selecting the electrochemical model as the estimation model.

19. The method according to claim 18, wherein the estimating of the initial condition comprises calculating either one or both of battery SOC and the Li ion concentration at a use suspension time point of the battery, and estimating the initial condition of the battery using either one or both of an electrode reaction relationship and a concentration gradient of Li ions during a battery reoperation time.

20. The method according to claim 18, wherein the estimating of the initial condition comprises functionalizing the electrochemical model as a function of a battery reoperation time at a use suspension time point of the battery.

21. The method according to claim 18, wherein, in response to a concentration gradient of Li ions being a set value or less, the estimating of the initial condition comprises estimating the initial condition of the battery based on the battery SOC at a use suspension time point of the battery.

22. The method according to claim 17, wherein, in response to the battery reoperation time point being after the stabilizing time, the selecting of the estimation model comprises selecting the OCV estimation method as the estimation model, and
    the estimating of the initial condition comprises measuring an OCV, and estimating the initial condition of the battery corresponding to the measured OCV by applying the OCV estimation method.

23. The apparatus according to claim 17, wherein, in response to the battery reoperation time point being within a time period of a stabilizing time boundary, the selecting of the estimation model comprises selecting both of the electrochemical model and the OCV estimation method as the estimation models, and
    the estimating of the initial condition comprises applying a weighted value to each of the electrochemical model and the OCV estimation method according to a proximity degree of the battery reoperation time point.

24. The method according to claim 14, wherein the estimating of the initial condition comprises estimating the initial condition of the battery based on a heat management condition comprising any one or any combination of two or more of a cell temperature, a cooling state, and a heating state.

25. A non-transitory computer-readable storage medium storing instructions that, when executed by a processor, cause the processor to perform the method of claim 14.

* * * * *